United States Patent
Hu et al.

(10) Patent No.: US 10,573,551 B2
(45) Date of Patent: Feb. 25, 2020

(54) ETCHING METHOD AND FABRICATION METHOD OF SEMICONDUCTOR STRUCTURES

(71) Applicants: Semiconductor Manufacturing International (Shanghai) Corporation, Shanghai (CN); Semiconductor Manufacturing International (Beijing) Corporation, Beijing (CN)

(72) Inventors: Min Da Hu, Shanghai (CN); Er Hu Zheng, Shanghai (CN); Cheng Long Zhang, Shanghai (CN); Hai Yang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/475,413

(22) Filed: Mar. 31, 2017

(65) Prior Publication Data

US 2017/0294343 A1 Oct. 12, 2017

(30) Foreign Application Priority Data

Apr. 7, 2016 (CN) ............. 2016 1 0213588

(51) Int. Cl.
*H01L 21/768* (2006.01)
*H01L 21/311* (2006.01)
*H01L 29/66* (2006.01)

(52) U.S. Cl.
CPC .. *H01L 21/76831* (2013.01); *H01L 21/31116* (2013.01); *H01L 21/76802* (2013.01); *H01L 21/76897* (2013.01); *H01L 29/6656* (2013.01); *H01L 2221/1063* (2013.01)

(58) Field of Classification Search
None
See application file for complete search history.

(56) References Cited

U.S. PATENT DOCUMENTS

| | | | |
|---|---|---|---|
| 6,417,066 B1* | 7/2002 | Lou | H01L 28/88 257/E21.013 |
| 6,617,253 B1 | 9/2003 | Chu et al. | |
| 2002/0072016 A1* | 6/2002 | Chen | G03F 7/427 430/323 |
| 2004/0038546 A1 | 2/2004 | Ko et al. | |

(Continued)

*Primary Examiner* — Anthony Ho
*Assistant Examiner* — Kevin Quinto
(74) *Attorney, Agent, or Firm* — Anova Law Group, PLLC

(57) ABSTRACT

An etching method and a fabrication method of semiconductor structures are provided. The etching method includes forming trenches in a to-be-etched structure, and forming a dielectric layer in the trenches. The etching method further includes etching the dielectric layer in the trenches by an etching process, and controlling at least an etching temperature of the etching process while a polymer is formed on side surface of the to-be-etched structure. During the etching process of the dielectric layer, the polymer undergoes a deposition stage and a removal stage. The deposition stage has a deposition rate of the polymer greater than an etch rate of the polymer, and the removal stage has the deposition rate of the polymer less than the etch rate of the polymer.

17 Claims, 6 Drawing Sheets

(56) References Cited

U.S. PATENT DOCUMENTS

| | | | |
|---|---|---|---|
| 2005/0287815 A1* | 12/2005 | Lai | H01L 21/30655 |
| | | | 438/710 |
| 2007/0287299 A1* | 12/2007 | Lee | H01L 21/0337 |
| | | | 438/761 |
| 2009/0280633 A1* | 11/2009 | Wei | H01L 21/76897 |
| | | | 438/597 |
| 2015/0235860 A1 | 8/2015 | Tomura et al. | |

* cited by examiner

ETCHING METHOD AND FABRICATION METHOD OF SEMICONDUCTOR STRUCTURES

CROSS-REFERENCES TO RELATED APPLICATIONS

This application claims the priority of Chinese patent application No. 201610213588.8, filed on Apr. 7, 2016, the entirety of which is incorporated herein by reference.

FIELD OF THE DISCLOSURE

The present disclosure generally relates to the field of semiconductor manufacturing technology and, more particularly, relates to an etching method and a fabrication method of semiconductor structures.

BACKGROUND

With the rapid development of semiconductor manufacturing technologies, semiconductor device evolves in a direction towards higher component density and higher integration degree.

The improvement in the integration degree of the semiconductor device causes a reduction in the distance between adjacent gate electrode structures, and common-drain MOS transistors are emerged. To accommodate the reduced distance between gate electrode structures in the common-drain MOS transistors, the application of self-aligned scheme in semiconductor processes has become more and more important.

The self-aligned contact (SAC) technology has been applied to fabricate metal contact structures. The SAC technology may realize the etching of relatively deep patterns such as trenches, through-holes, etc., with a relatively high aspect ratio that are disposed between adjacent gate electrode structures, thereby electrically connecting the drain electrodes of the common-drain MOS transistors to the external circuit.

However, issues are commonly found in the current SAC technology as the etching process can be easily terminated and the damages to the through-hole sidewalls are relatively large.

The disclosed etching method and fabrication method of semiconductor structures are directed to at least partially solving one or more problems set forth above and other problems.

BRIEF SUMMARY OF THE DISCLOSURE

One aspect of the present disclosure provides an etching method. The etching method includes forming trenches in a to-be-etched structure, and forming a dielectric layer in the trenches. The etching method further includes etching the dielectric layer in the trenches by an etching process, and controlling at least an etching temperature of the etching process while a polymer is formed on side surface of the to-be-etched structure. During the etching process of the dielectric layer, the polymer undergoes a deposition stage and a removal stage. The deposition stage has a deposition rate of the polymer greater than an etch rate of the polymer, and the removal stage has the deposition rate of the polymer less than the etch rate of the polymer.

Another aspect of the present disclosure includes a fabrication method for semiconductor structures. The fabrication method includes forming a plurality of device structures on a substrate, and forming sidewall spacers on side surfaces of each device structure to provide trenches on the substrate between adjacent device structures and sidewall spacers. The fabrication method further includes forming a dielectric layer in the trenches, etching the dielectric layer in the trenches by an etching process, and controlling at least an etching temperature of the etching process while a polymer is formed on side surface of the to-be-etched structure. During the etching process of the dielectric layer, the polymer undergoes a deposition stage and a removal stage. The deposition stage has a deposition rate of the polymer greater than an etch rate of the polymer, and the removal stage has the deposition rate less than the etch rate.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the sane reference numbers will be used throughout the drawings to refer to the same or like parts.

Figure 1:
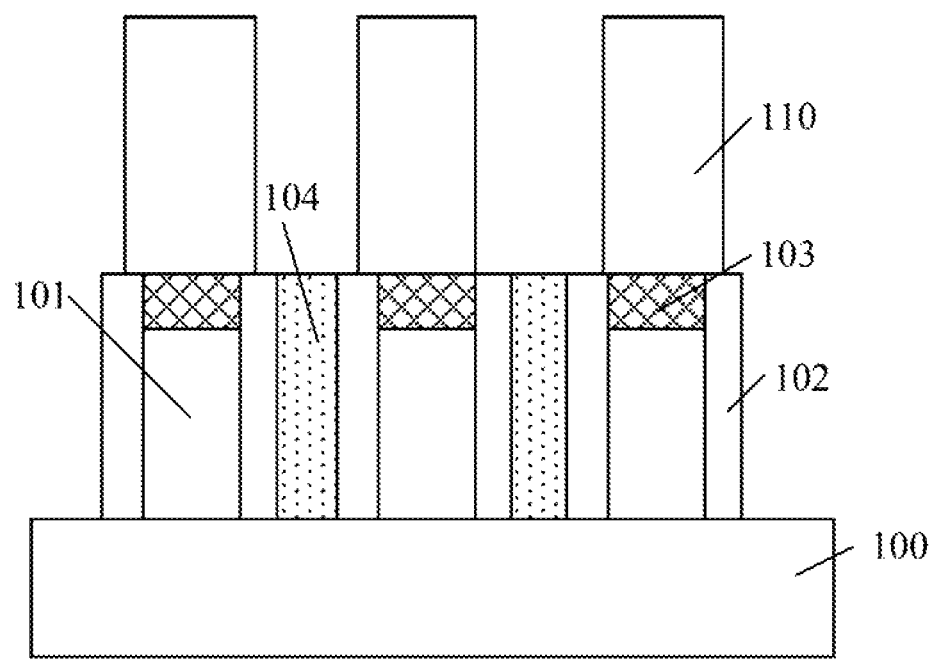
FIG. 1 and FIG. 2 illustrate intermediate structures corresponding to each step of an exemplary etching method consistent with the disclosed embodiments.
Figure 2:
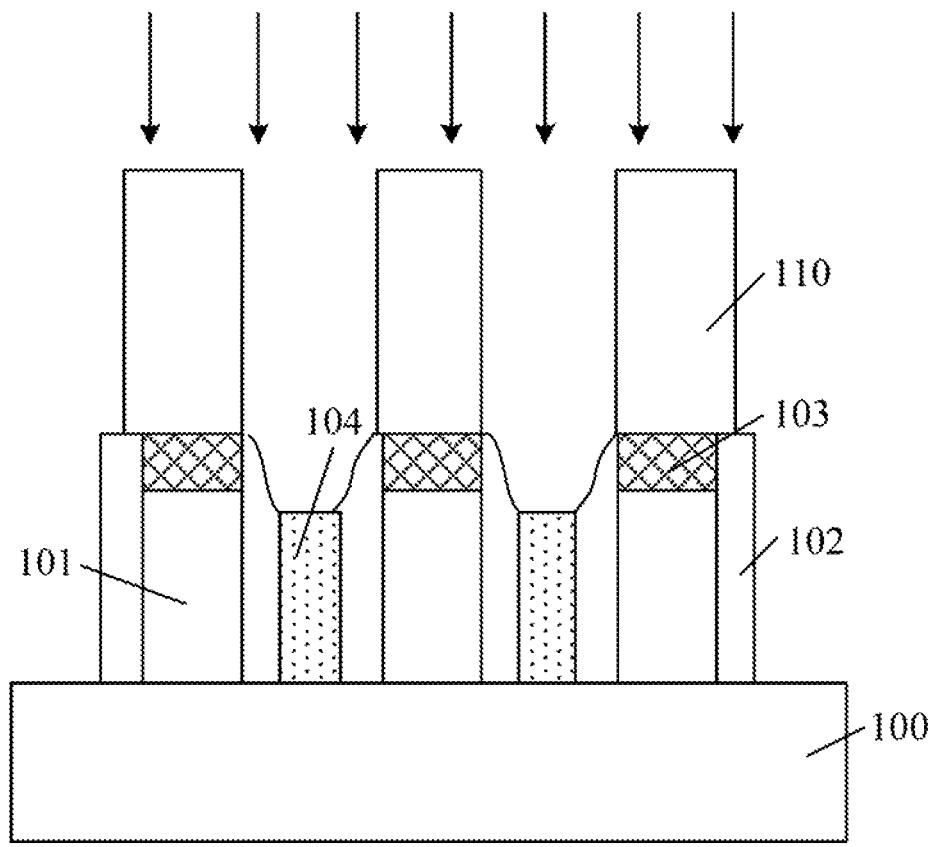

FIG. 1 and FIG. 2 illustrate intermediate structures corresponding to each step of an exemplary etching method consistent with the disclosed embodiments.

FIG. 1 provides a semiconductor structure, and the semiconductor structure may include a substrate 100, a plurality of gate electrodes 101 disposed on the substrate 100, sidewall spacers 102 formed on side surfaces of gate electrodes 101, and a mask layer 103 on top surface of the gate electrodes 101. Trenches may be disposed between adjacent gate electrodes 101, and a dielectric layer 104 may be formed in the trenches.

Further, a patterned photoresist layer 110 may be formed on surface of the semiconductor structure, and the patterned photoresist layer 110 may have openings (not labeled) exposing top surface of the dielectric layer 104.

Referring to FIG. 2, the dielectric layer 104 is etched. During the etching process of the dielectric layer 104, the etching conditions may remain unchanged and a polymer may be produced, for example, by a reaction between etchant and the sidewall spacers 102. In the etching method, the distance between adjacent side surfaces of each trench may be relatively small. Thus, after the photoresist layer 110 is formed, due to the resolution limit of the photolithography process, the photoresist layer 110 may expose portions of top surface of the sidewall spacers 102. Accordingly, damages to the sidewall spacers 102 during the etching process may need to be avoided.

During the etching process of the dielectric layer 104, if the deposition rate of the polymer is greater than the etch rate, the polymer may be deposited on surface of the sidewall spacers 102 and on surface of the dielectric layer 104. If the deposition rate of the polymer is smaller than the etch rate, the sidewall spacers 102 and the dielectric layer 104 may be etched continuously.

During the whole etching process, the etching conditions may remain unchanged, then during the etching process, polymer may be deposited continuously, or the sidewall spacers 102 and the dielectric layer 104 may be etched continuously. Specifically, if the etch rate of the polymer is relatively large, the sidewall spacers 102 may be etched easily, which increases the loss of the sidewall spacers 102, thus exposing the gate electrodes 101. If the etch rate in the whole etching process is relatively low, a relatively large amount of the polymer may be deposited on surface of the dielectric layer 104, thus terminating the etching of the dielectric layer 104.

The present disclosure provides an exemplary etching method, including providing a to-be-etched structure. Trenches may be formed in the to-be-etched structure, and a dielectric layer may be disposed in the trenches. The etching method may further include etching the dielectric layer in the trenches. When etching the dielectric layer, polymer may be formed on side surfaces of the to-be-etched structure. By varying the etching temperature, the etching process may include a deposition stage and a removal stage of the polymer. During, the deposition stage, the deposition rate of the polymer may be greater than the etch rate of the polymer on the surface of the to-be-etched structure. During the removal stage, the deposition rate of the polymer may be smaller than the etch rate of the polymer on the surface of the to-be-etched structure.

In the disclosed etching method, by varying the etching temperature, the etching process may be changed, and the etching process may include a deposition stage and a removal stage of the polymer. During the deposition stage, the deposition rate of the polymer may be greater than the etch rate of the polymer on the surface of the to-be-etched structure. During the removal stage, the deposition rate of the polymer may be smaller than the etch rate of the polymer on the surface of the to-be-etched structure. Further, during the deposition stage, the polymer may be deposited on the surface of the to-be-etched structure, thus protecting the to-be-etched structure in the follow-up removal stage and reducing the loss of the to-be-etched structure. During the removal stage, the polymer deposited on the surface of the to-be-etched structure may be etched and removed, thus preventing the termination of the etching process caused by accumulation of too much polymer on the surface of the to-be-etched structure.

To make the above goals, features, and advantages of the present disclosure more apparent and understandable, specific embodiments of the present disclosure will be made in detail with reference to the accompanying drawings.

Figure 3:
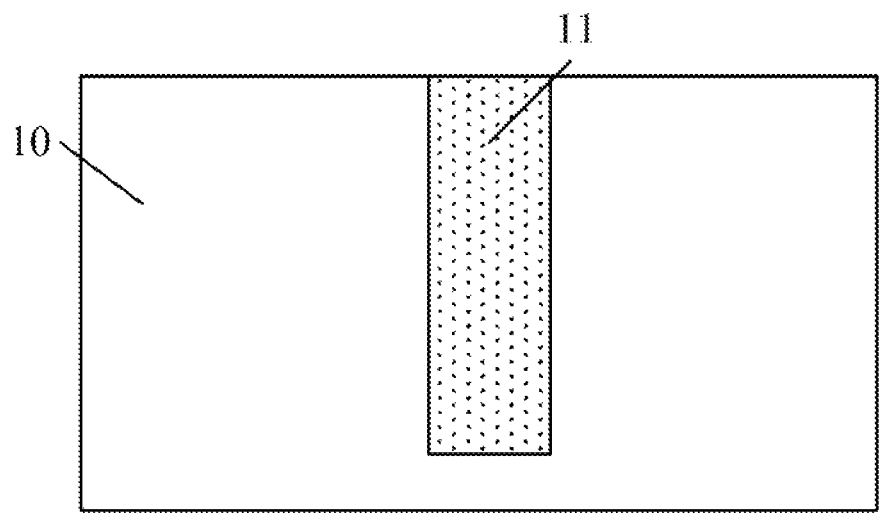
FIG. 3 and FIG. 4 illustrate intermediate structures corresponding to each step of an exemplary etching method consistent with the disclosed embodiments.
Figure 4:
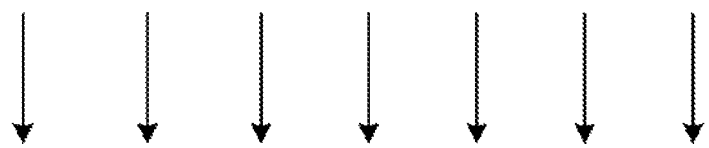
Figure 4:
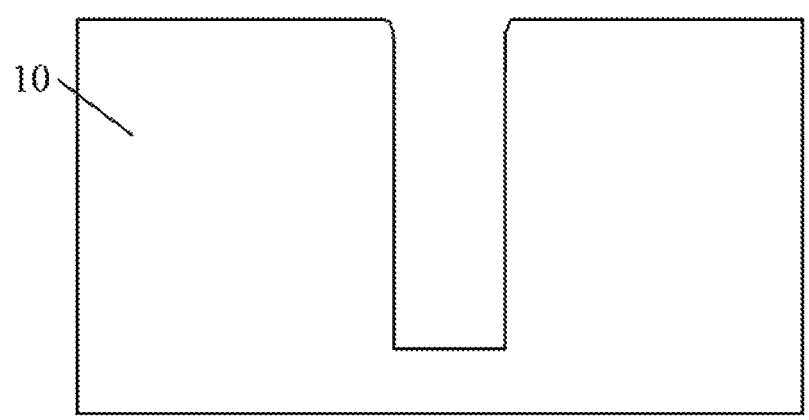

FIG. 3 and FIG. 4 illustrate intermediate structures corresponding to each step of an exemplary etching method consistent with the disclosed embodiments. Referring to FIG. 3 and FIG. 4, the etching method may include providing a to-be-etched structure 10, forming trenches in the to-be-etched structure 10, and disposing a dielectric layer 11 in the trenches.

The dielectric layer 11 in the trenches may be etched and, during the etching process, polymer may be formed on the surface of the to-be-etched structure 10. Further, during the etching process, by varying the etching temperature, the etching process may include a deposition stage and a removal stage of the polymer. During the deposition stage, the deposition rate of the polymer may be greater than the etch rate of the polymer on the surface of the to-be-etched structure 10. During the removal stage, the deposition rate of the polymer may be smaller than the etch rate of the polymer on the surface of the to-be-etched, structure 10.

Referring to FIG. 3, the trenches may be formed in the to-be-etched structure 10, and the dielectric layer 11 may be formed in the trenches. In one embodiment, the material of the to-be-etched structure 10 may be silicon nitride and, in other embodiments, the material of the to-be-etched structure 10 may also be silicon oxynitride. In one embodiment, the material of the dielectric layer 11 may be silicon oxide and, in other embodiments, the material of the dielectric layer may also be silicon oxynitride.

Referring, to FIG. 4, the dielectric layer 11 may be etched. During the etching process, polymer may be formed on the surface of the to-be-etched structure 10, and by varying the etching temperature, the etching process of the dielectric layer 11 may include the deposition stage and the removal stage of the polymer. During the deposition stage, the deposition rate of the polymer may be greater than the etch rate of the polymer on the surface of the to-be-etched structure During the removal stage, the deposition rate of the polymer may be smaller than the etch rate of the polymer on the surface of the to-be-etched structure 10.

In one embodiment, by varying the etching temperature, the etching process may be changed and, thus, the etching process may include the deposition stage of the polymer and the removal stage of the polymer. Specifically, in one embodiment, the deposition stage and the removal stage may appear alternatingly and repeatedly, resulting in the alternating and repeated occurrence of polymer deposition and polymer removal. Accordingly, the loss of the to-be-etched structure 10 may be reduced, and the etching may not be terminated easily.

From the above analysis, the disclosed etching method may be applied to etch the dielectric layer 11 in the trenches with a relatively large aspect ratio. Specifically, in one embodiment, the aspect ratio of the trenches may be greater than 7.

In one embodiment, the dielectric layer 11 may be etched via an anisotropic dry etching process, and the vertical etch rate may be greater than the horizontal etch rate in the anisotropic dry etching process. Accordingly, in the etching process, the loss of the to-be-etched structure 10 may be relatively small. The disclosed etching may be anisotropic etching, and the vertical etch rate may be relatively large, that is, the etch rate of the dielectric layer 11 may be relatively large. During the whole etching process, the vertical deposition rate of the polymer may be smaller than the etch rate. Accordingly, the etching of the dielectric layer 11 may not be easily terminated in the whole process.

In one embodiment, the deposition stage and the removal stage may form an etching circle, and the etching process may include a plurality of etching circles. In other embodiments, the etching process may only include one etching circle.

Specifically, the number of the etching circles may be selected according to the thickness of the dielectric layer 11. The thickness of the dielectric layer 11 may refer to the distance from the top surface of the dielectric layer 11 to the bottom of the trenches. In one embodiment, the thickness of the dielectric layer 11 may be approximately 100 Å~300 Å, anti the number of the etching circles included in the etching process may be greater than 4. In one embodiment, when etching the dielectric layer 11, the plurality of etching circles may be the same, in other embodiments, the plurality of etching circles may be different.

In one embodiment, the etching gas may be one or more selected from $CF_4$, $C_3F_8$, and $C_4F_8$. In one embodiment, the temperature at which the deposition rate of the polymer is equal to the etch rate of the polymer on the surface of the to-be-etched structure 10 may be an equilibrium temperature. In the etching process, the etching temperature may include a first temperature higher than the equilibrium temperature and a second temperature lower than the equilibrium temperature.

In one embodiment, the etching temperature may be expressed as a sine function of the time. In other embodiments, the etching temperature may also be expressed as other trigonometric functions regarding the time. In one embodiment, T may represent the etching temperature, and t may represent the etching time. The relationship between the etching temperature T and the etching time t may be shown as follows:

$$T=T_0+T_1 \sin(2\pi t/t_0)$$

Where, $T_0$ is the equilibrium temperature, $T_1$ is the amplitude of variation of the etching temperature indicating the maximum value of the etching temperature deviating from the equilibrium temperature $T_0$, and $t_0$ is the duration of the etching circle.

The first time when the etching temperature equals to the equilibrium temperature may be labeled as $t_1$. In one embodiment, $t_1$ may refer to a moment after the time when the etching begins.

In one embodiment, the polymer may be a material produced by reaction between the etching gas and the sidewall spacers. The equilibrium temperature $T_0$ may be within the range of approximately 60° C.~80° C.

In one embodiment, if the amplitude of the variation of the etching temperature is too small, the deposition stage and the removal stage of the polymer may not be easily controlled. For example, the amplitude of the variation of the etching temperature may be greater than 30° C.

If the duration of the etching circle $t_0$ is too small, the requirements of the device may easily become higher. In one embodiment, the duration of the etching circle $t_0$ may be longer than 10 seconds.

In one embodiment, as the etching temperature increases, the etch rate of the polymer may be increased and the deposition rate of the polymer may be reduced. That is, when the etching temperature is the second temperature, the etching process may be in the deposition stage. When the etching temperature is the first temperature, the etching process may be in the removal stage. The first temperature and the second temperature may occur alternatingly, and the polymer may be deposited or etched alternatingly, which reduces the loss of the to-be-etched structure, and prevents the etching from being terminated.

As such, in the disclosed etching method, by varying the etching temperature, the etching process may be changed, and the etching process may include a deposition stage and a removal stage of the polymer. During the deposition stage, the deposition rate of the polymer may be greater than the etch rate of the polymer on the surface of the to-be-etched structure. During the removal stage, the deposition rate of the polymer may be smaller than the etch rate of the polymer on the surface of the to-be-etched structure. In the deposition stage, the polymer may be deposited on the surface of the to-be-etched structure, thus protecting the to-be-etched structure in the follow-up removal stage and reducing the loss of the to-be-etched structure. In the removal stage, the polymer deposited on the surface of the to-be-etched structure may be etched, thus preventing the termination of the etching process caused by accumulation of too much polymer on the surface of the to-be-etched structure.

FIG. 5~FIG. 9 illustrate intermediate structures corresponding tort exemplary fabrication method of a semiconductor structure consistent with the disclosed embodiments.

Figure 10:
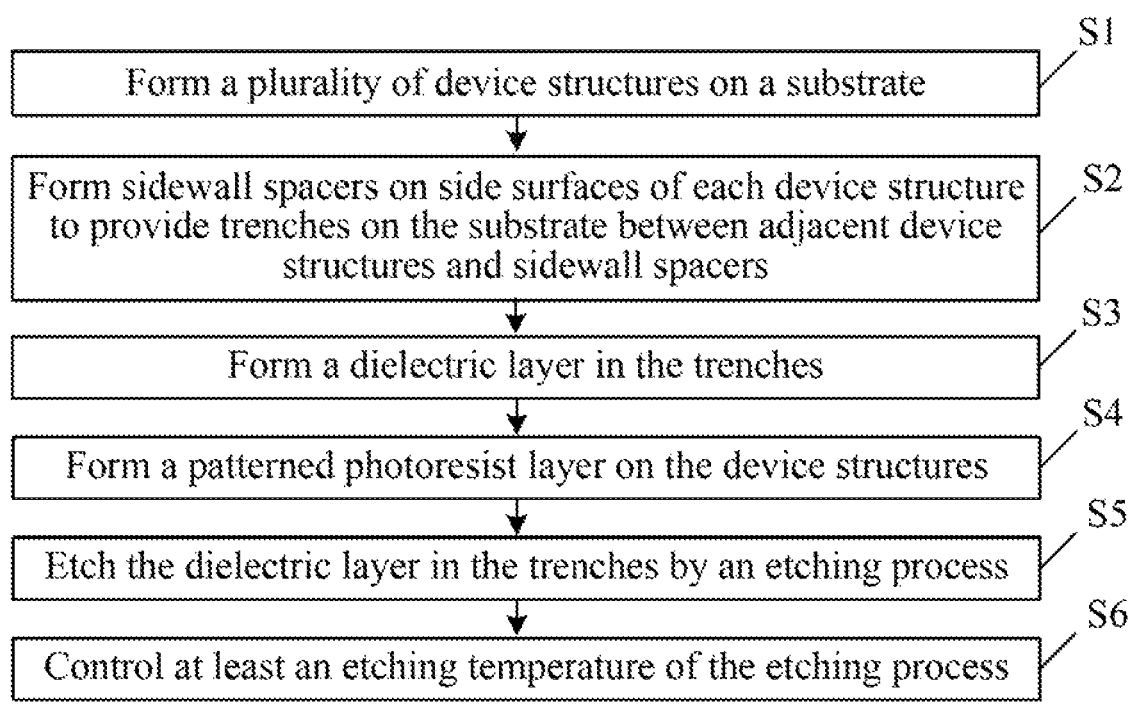
FIG. 10 illustrates a flow chart of an exemplary fabrication method of a semiconductor structure consistent with the disclosed embodiments.

FIG. 10 illustrates a flow chart of an exemplary fabrication method of a semiconductor structure consistent with the disclosed embodiments.

Referring to FIG. 5~FIG. 10, the fabrication method of the semiconductor structure may include providing a substrate 200. A plurality of device structures 201 (e.g., gate electrode structures) may be disposed on surface of the substrate 200, and the sidewall spacers 202 may be disposed on side surfaces of the device structures 201. A mask layer 203 may be disposed on the top surface of the device structure 201, and trenches may be formed between sidewall spacers 202 of adjacent device structures 201 and the.

A dielectric layer 204 may be formed on the surface of the substrate 200 and the surface of the sidewall spacers 202. The dielectric layer 204 in the trenches may be etched, and polymer may be formed on the surface of the sidewall spacers 202. During the etching process of the dielectric layer 204, by varying the etching temperature, the etching process may include the deposition stage and the removal stage of the polymer. During the deposition stage, the deposition rate of the polymer may be greater than the etch rate of the polymer on the surface of the sidewall spacers 202. During the removal stage, the deposition rate of the polymer may be smaller than the etch rate of the polymer on the surface of the sidewall spacers 202.

In the SAC technology, the distance between adjacent gate electrode structures may be relatively small, resulting in a relatively high aspect ratio of the trenches between the gate electrode structures, and the difficulty to etch the dielectric layer 204 in the trenches may be relatively large. In the present disclosure, the etching method is illustrated in detail in hope of solving the etching difficulty in the SAC technique.

Figure 5:
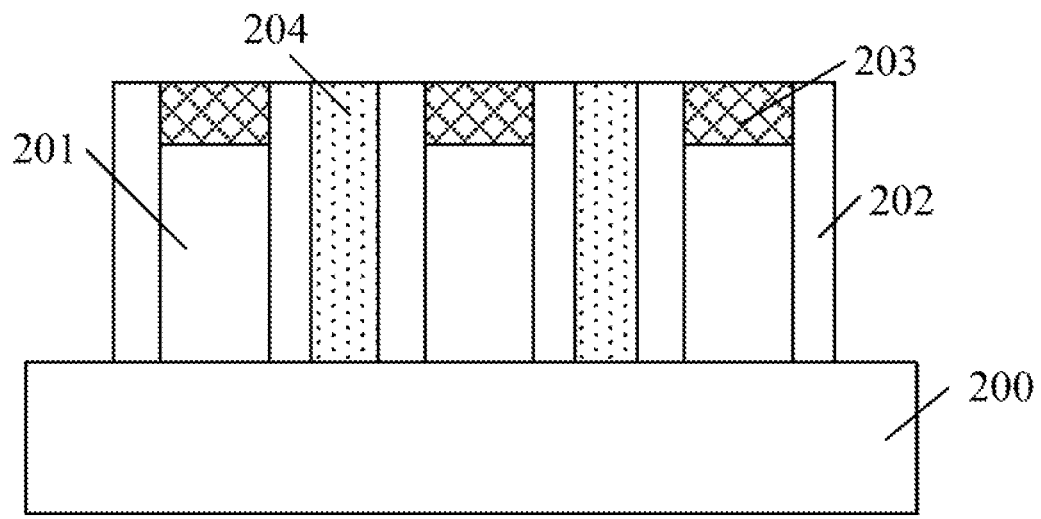
FIG. 5~FIG. 9 illustrate intermediate structures corresponding to an exemplary fabrication method of a semiconductor structure consistent with the disclosed embodiments.

FIG. 5 provides the substrate 200, and the plurality of device structures 201 may be disposed on the surface of the substrate 200 (S1). The sidewall spacers 202 may be formed on side surfaces of the device structures 201, the mask layer 203 may be formed on the top surface of the device structures 201, and the trenches may be disposed between adjacent device structures 201 and sidewall spacers 202 (S2).

In one embodiment, the device structures 201 disposed on the substrate 200 may be gate electrode structures. In one embodiment, the sidewall spacers 202 may be used to protect the side surfaces of the gate electrode structures 201. The mask layer 203 may be used to protect the top surface of the gate electrode structures 201.

To improve the integration degree of the semiconductor device, the aspect ratio of the trenches may be relatively large. Specifically, in one embodiment, the aspect ratio of the trenches may be greater than 7:1. The trench may have a width of less than about 25 nm.

In one embodiment, the fabrication method may also include forming a source region and a drain region on two sides of the gate electrode structures 201 on the substrate 200. In one embodiment, by ion injection, the two sides of the gate electrode structures 201 on the substrate 200 may be doped to form the source region and the drain region.

Further, referring to FIG. 5, the dielectric layer 204 may be formed on the surface of the substrate 200 and the surfaces of the sidewall spacers 202. That is, the dielectric layer 204 may be formed in the trenches (S3). In one embodiment, the materials of the dielectric layer 204 and the sidewall spacers 202 may be different. During the etching process, the materials of the sidewall spacers 202 and the dielectric layer 204 may be different. When etching the dielectric layer 204, the loss of the sidewall spacers 202 may be relatively small.

In one embodiment, the material of the sidewall spacers 202 may be silicon nitride and, in other embodiments, the material of the sidewall spacers 202 may be silicon oxynitride. In one embodiment, the material of the dielectric layer 204 may be silicon oxide and, in some other embodiments, the material of the dielectric layer may be silicon nitride.

Figure 6:
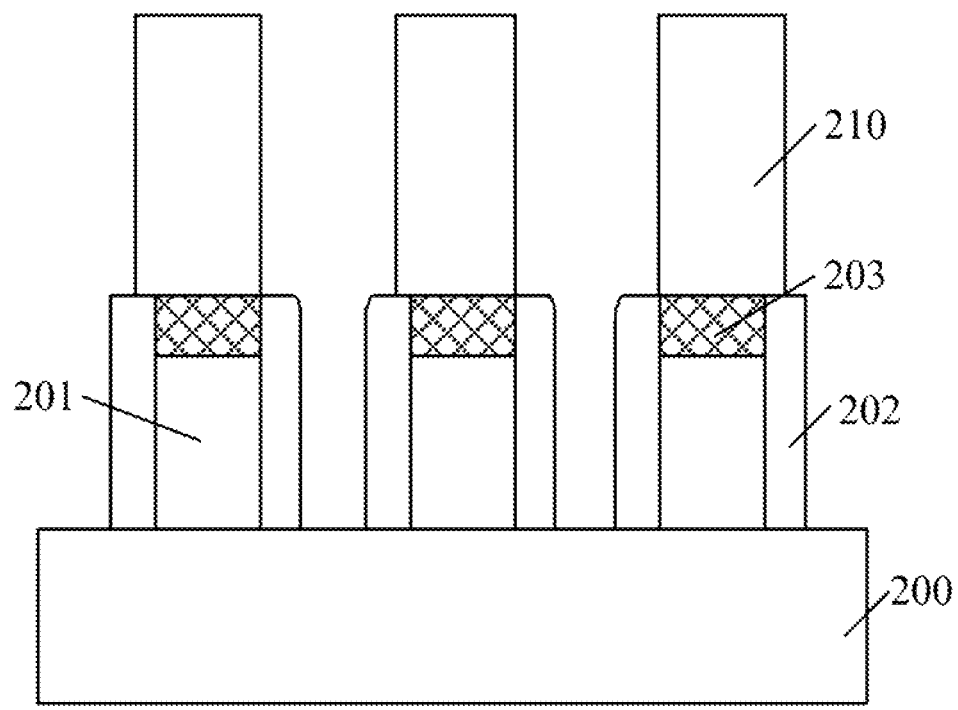

In step 4 of FIG. 10 and referring to FIG. 6, after forming the dielectric layer 204, the fabrication method may also include forming a patterned photoresist layer 210 on the semiconductor structure. More specifically, the photoresist layer 210 may be disposed on the gate electrode structures 201 and have openings to expose the trenches. The photoresist layer 210 may be used to protect the gate electrode structures 201 from being etched during the follow-up etching process.

In one embodiment, the distance between adjacent gate electrode structures 201 may be relatively small. Due to the limit of the photolithography process, the photoresist 210 may only cover portions of top surface of the sidewall spacers 202, and expose other portions of the top surface of the sidewall spacers 202. Accordingly, when etching the dielectric layer 204, the sidewall spacers 202 exposed by the photoresist 210 may be easily etched.

Figure 7:
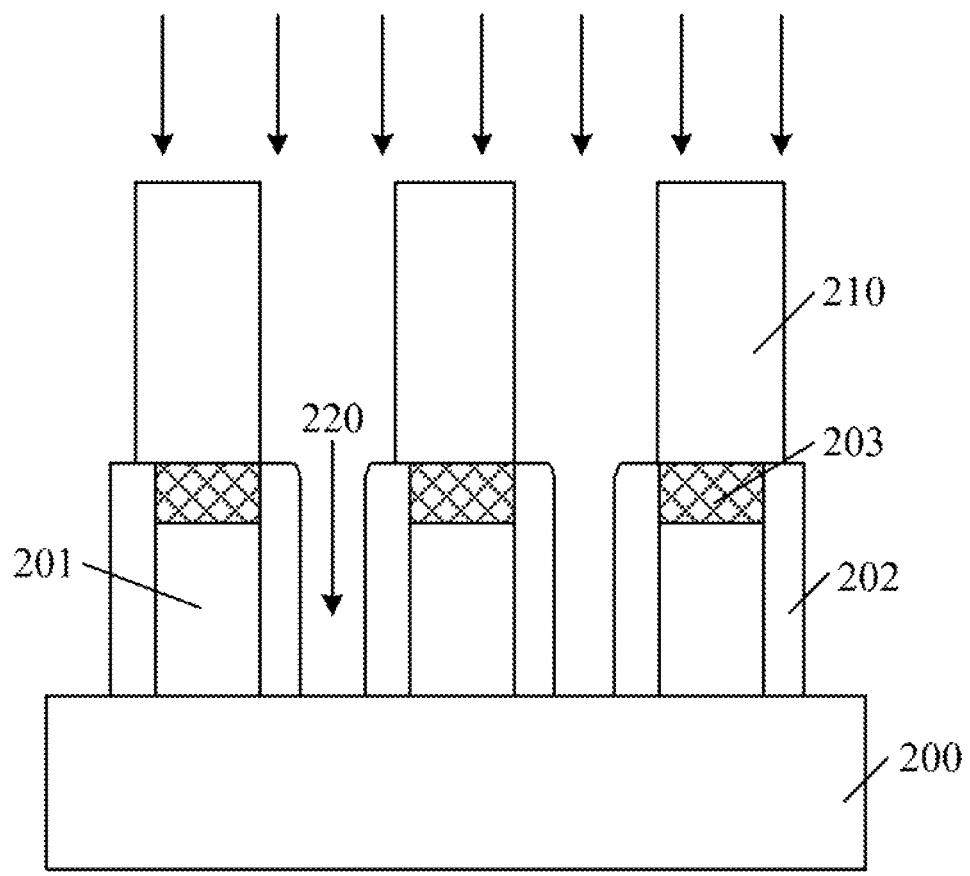
Figure 8:
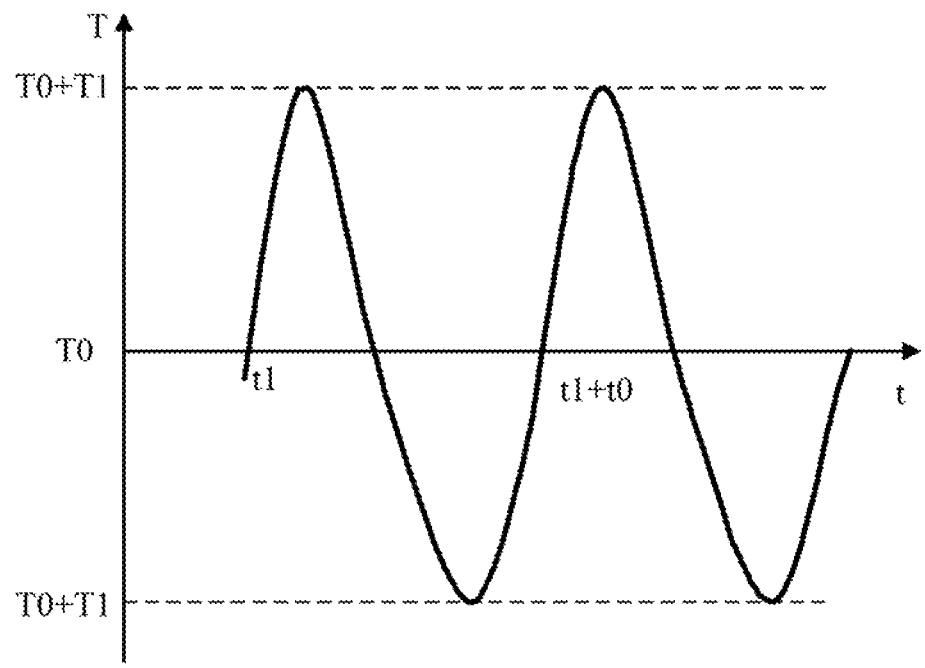

Referring to FIG. 7 and FIG. 8, FIG. 8 illustrates a curve of etching temperature varying with etching time during an etching process, where the horizontal-axis represents the etching time, and the vertical-axis represents the etching temperature.

The dielectric layer 204 may be etched (S5). The polymer may be produced during the etching process, and by varying the etching temperature, the etching process may include a deposition stage and a removal stage of the polymer. During the deposition stage, the deposition rate of the polymer 202 may be greater than the etch rate of the polymer on the surface of the sidewall spacers. In the removal stage, the deposition rate of the polymer may be smaller than the etch rate of the polymer on the surface of the sidewall spacers 202.

During the etching process, by varying the etching temperature, the deposition rate of the polymer may be greater than the etch rate of the polymer on the surface of the sidewall spacers 202 in the deposition stage (S6). Accordingly, the polymer may be deposited on the surface of the sidewall spacers 202, thus protecting the sidewall spacers 202 from being etched in the follow-up removal stage. During the removal stage, the polymer on the surface of the sidewall spacers 202 may be etched and removed, thus reducing the polymer deposited on the surface of the sidewall spacers 202, which further decreases the possibility of the etching termination.

In one embodiment, the deposition stage and the removal stage may form an etching circle. The etching process may include a plurality of etching circles. In other embodiments, the etching process may also include one etching circle.

Specifically, the number of the etching circles may be selected according to the thickness of the dielectric layer 204. The thickness of the dielectric layer 204 may refer to the distance from the top surface of the dielectric layer 204 to the bottom of the trenches. In one embodiment, the thickness of the dielectric layer may be approximately 100 Å~300 Å. The etching circles included in the etching process may be greater than 4.

In one embodiment, during the etching process of the dielectric layer 204, the plurality of etching circles may be the same. In other embodiments, the plurality of etching circles may be different.

In one embodiment, the dielectric layer 204 may be etched by anisotropic dry etching, and the vertical etch rate of the anisotropic dry etching may be greater than the horizontal etch rate. Accordingly, during the etching process, the loss of the sidewall spacers 202 may be relatively small. The etching may be the anisotropic etching, and the vertical etch rate may be relatively large. That is, the etch rate of the dielectric layer 204 may be relatively large. During the whole etching process, the vertical deposition rate of the polymer may be smaller than the etch rate of the polymer. Accordingly, the etching of the dielectric layer 204 may not be terminated easily.

In one embodiment, the etching gas is one or more selected from $CF_4$, $C_3F_8$, and $C_4F_8$.

By varying the etching temperature, the etching process may be changed, and the etching process may include the deposition stage of the polymer and the removal stage of the polymer. Specifically, in one embodiment, the deposition stage and the removal stage may appear alternatingly and repeatedly, resulting in the alternating occurrence of polymer deposition and polymer removal. Accordingly, the loss of the sidewall spacers 202 may be reduced, and the etching may not be terminated easily.

In one embodiment, the etching temperature varying with the etching time is illustrated in FIG. 8.

The temperature at which the deposition rate of the polymer is equal to the etch rate of the polymer on the surface of the sidewall spacers 202 (as shown in FIGS. 5-7) may be the equilibrium temperature. In one embodiment, the etching temperature may include the first temperature higher than the equilibrium temperature and the second temperature lower than the equilibrium temperature.

In one embodiment, the etching temperature may be a sine function of the time. In other embodiments, the etching temperature may also be other trigonometric functions of the time. In one embodiment, T may represent the etching temperature, and t may represent the etching time. The relationship between the etching temperature T and the etching time t may be shown as follows:

$T=T_0+T_1 \sin(2\pi t/t_0)$ $T_0$ is the equilibrium temperature, $T_1$ is the amplitude of variation of the etching temperature indicating the maximum value of the etching temperature deviating from the equilibrium temperature $T_0$ and $t_0$ is the duration of the etching circle.

The first time when the etching temperature is the equilibrium temperature is $t_1$. In one embodiment, $t_1$ may be greater than the time when the etching begins.

In one embodiment, the polymer may be a material produced by reaction between the etching gas and the sidewall spacers. The equilibrium temperature $T_0$ may be within the range of approximately 60° C.~80° C.

In one embodiment, if the amplitude of variation of the etching temperature is too small, the deposition stage and the removal stage may not be easily controlled. Specifically, the amplitude of variation of the etching temperature may be greater than 30° C.

If the time for the etching circle to is too small, the requirements of the device may easily increase. In one embodiment, the time for the etching circle $t_0$ may be longer than 10 seconds.

In one embodiment, as the etching temperature increases, the etch rate of the polymer may be increased and the deposition rate of the polymer may be reduced. That is, when the etching temperature is the second temperature, the etching process may be in the deposition stage. When the etching temperature is the first temperature, the etching process may be in the removal stage. The first temperature and the second temperature may occur alternatingly, and the polymer may be deposited or etched, resulting in a reduction in the loss of the sidewall spacers 202, which may prevent the etching from being terminated.

By adjusting the etching temperature, the deposition and etching of the polymer may be controlled, the etching process may be carried out continuously, and the etching efficiency may be increased. Accordingly, by controlling the etching temperature, the operation may be relatively simple.

In one embodiment, the deposition stage and the removal stage of the polymer may form an etching circle. The etching stage may vary periodically using the etching circle as a period. Accordingly, the process that the polymer is deposited on the side surfaces of the sidewall spacers 202 and then etched may be continuously repeated during the etching process of the dielectric layer 204. Thus, the loss of the sidewall spacers 202 may be reduced, and the etching termination may be prevented.

Figure 9:
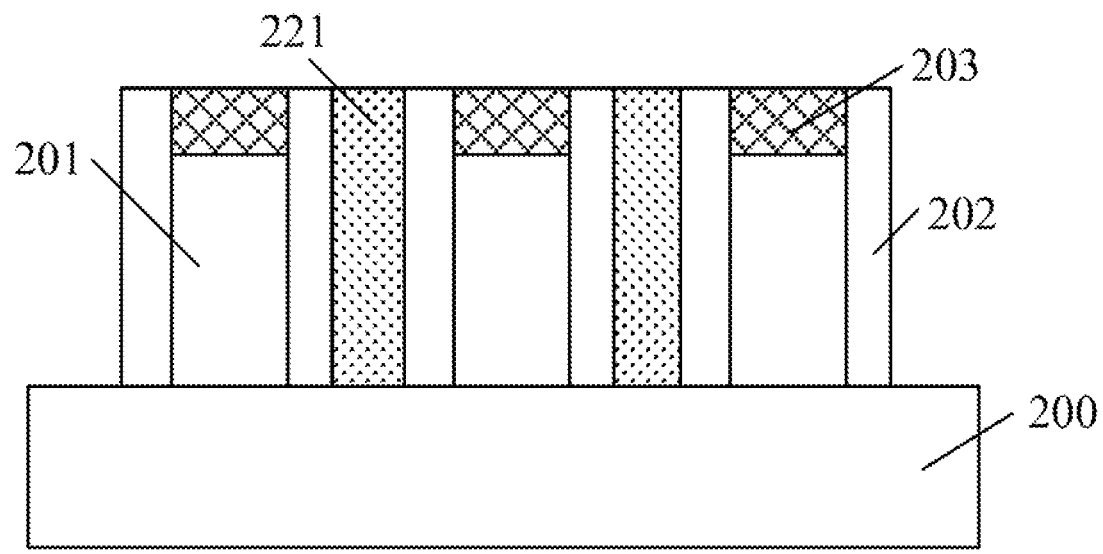

In one embodiment, in a step where the dielectric layer 204 is etched, the etching process may not be terminated until the source region or the drain region is exposed, thus forming contact holes 220 (as shown in FIG. 7). Referring to FIG. 9, in one embodiment, after forming the contact holes 220, plugs 221 may be formed in the contact holes 220.

The plugs 21 may be formed by any suitable materials. In one embodiment, the material of the plugs 221 may be copper. In other embodiments, the material of the plugs 221 may be tungsten.

As such, in the fabrication method of the semiconductor structure, by varying the etching temperature, the etching process may be controlled and changed, and the etching process of the dielectric layer may include the deposition stage and the removal stage of the polymer. During the deposition stage, the deposition rate of the polymer may be greater than the etch rate of the polymer on the surface of the sidewall spacers. During the removal stage, the deposition rate of the polymer may be smaller than the etch rate of the polymer on the surface of the sidewall spacers. In the deposition stage, the polymer may be deposited on the surface of the sidewall spacers, thus protecting the sidewall spacers in the follow-up removal stage and reducing the loss of the sidewall spacers. In the removal stage, the polymer deposited on the surface of the sidewall spacers may be etched, thus preventing the termination of the etching process caused by accumulation of too much polymer on the surface of the sidewall spacers.

Though the present disclosure is disclosed as above, the present disclosure is not limited thereto. Various modifications and alterations will be apparent to a anyone skilled in the art without departing from the spirit and scope of the present disclosure. Accordingly, the protection scope of the present disclosure is defined by the appended claims.

What is claimed is:

1. An etching method, comprising:
forming trenches in a to-be-etched structure;
forming a dielectric layer in the trenches;
etching the dielectric layer in the trenches by an etching process; and
controlling at least an etching temperature of the etching process while a polymer is formed on side surface of the to-be-etched structure,
wherein during the etching process of the dielectric layer, the polymer undergoes:
a deposition stage, having a deposition rate of the polymer greater than an etch rate of the polymer; and
a removal stage, having the deposition rate less than the etch rate, wherein:
a relationship between an etching temperature T and an etching time t is:

$$T=T_0+T_1 \sin(2\pi t/t_0)$$

wherein $T_0$ is an equilibrium temperature, $T_1$ is a maximum value of the etching temperature deviating from the equilibrium temperature $T_0$, and $t_0$ is a duration of an etching circle.

2. The etching method according to claim 1, wherein:
a duration of one etching circle is longer than 10 seconds.

3. The etching method according to claim 1, wherein:
the maximum value of the etching temperature deviating from the equilibrium temperature is greater than 30° C.

4. The etching method according to claim 1, wherein:
the equilibrium temperature is in a range of approximately 60° C.–80° C.

5. A fabrication method for semiconductor structures, comprising:
forming a plurality of device structures on a substrate,
forming sidewall spacers on side surfaces of each device structure to provide trenches on the substrate between sidewall spacers of adjacent device structures;
forming a dielectric layer in the trenches;
etching the dielectric layer in the trenches by an etching process; and
controlling at least an etching temperature of the etching process while a polymer is formed on side surface of the sidewall spacers of the adjacent device structures,
wherein during the etching process of the dielectric layer, the polymer undergoes:
a deposition stage, having a deposition rate of the polymer greater than an etch rate of the polymer; and
a removal stage, having the deposition rate less than the etch rate, and
the deposition stage and the removal stage appear alternatively.

6. The fabrication method according to claim 5, wherein:
the removal stage and the deposition stage of the polymer form an etching circle, and the etching process of the dielectric layer includes one or more etching circles.

7. The fabrication method according to claim 5, wherein:
the relationship between the etching temperature T and an etching time t is:

$$T=T_0+T_1 \sin(2\pi t/t_0)$$

wherein $T_0$ is an equilibrium temperature, $T_1$ is a maximum value of the etching temperature deviating from the equilibrium temperature $T_0$, and $t_0$ is a duration of an etching circle.

8. The fabrication method according to claim 7, wherein:
a duration of one etching circle is longer than 10 seconds.

9. The fabrication method according to claim 7, wherein:
the maximum value of the etching temperature deviating from the equilibrium temperature is greater than 30° C.

10. The fabrication method according to claim 7, wherein:
the equilibrium temperature is in a range of approximately 60° C.–80° C.

11. The fabrication method according to claim 5, wherein:
the device structures include gate electrode structures, and the fabrication method further includes:
forming a source region and a drain region on two sides of each gate electrode structure on the substrate.

12. The fabrication method according to claim 11, wherein:
the steps of etching the dielectric layer in the trenches includes etching the dielectric layer until the source region or the drain region is exposed, and forming contact holes; and
the fabrication method further includes: forming plugs in the contact holes.

13. The fabrication method according to claim 5, wherein:
a temperature at which the deposition rate of the polymer is equal to the etch rate of the polymer is an equilibrium temperature,
the etching temperature for etching the dielectric layer includes a first temperature higher than the equilibrium temperature and a second temperature lower than the equilibrium temperature,
the etching temperature of the dielectric layer in the removal stage of the polymer is the first temperature, and
the etching temperature of the dielectric layer in the deposition stage of the polymer is the second temperature.

14. The fabrication method according to claim 5, wherein:
an etching gas for etching the dielectric layer includes one or more gases selected from $CF_4$, $C_3F_8$, and $C_4F_8$.

15. The fabrication method according to claim 5, wherein:
an aspect ratio of the trenches is greater than 7:1.

16. The fabrication method according to claim 5, wherein:
the trench has a width of less than 25 nm.

17. The fabrication method according to claim 5, wherein:
the sidewall spacers are formed of a material including silicon nitride, and
the dielectric layer is formed of a material including silicon oxide.

* * * * *